United States Patent
Lunglmayr et al.

(10) Patent No.: US 10,502,789 B2
(45) Date of Patent: Dec. 10, 2019

(54) METHOD AND DEVICE FOR DETERMINING A PARAMETER OF A MODEL OF A TECHNICAL INSTALLATION

(71) Applicant: Infineon Technologies AG, Neubiberg (DE)

(72) Inventors: Michael Lunglmayr, Alkoven (AT); Stefano Marsili, Faak am See (AT); Christoph Unterrieder, Klagenfurt (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 1305 days.

(21) Appl. No.: 14/303,531

(22) Filed: Jun. 12, 2014

(65) Prior Publication Data

US 2014/0372056 A1    Dec. 18, 2014

(30) Foreign Application Priority Data

Jun. 12, 2013  (DE) .......................... 10 2013 106 083

(51) Int. Cl.
    *G01R 31/367*  (2019.01)
    *G01R 31/387*  (2019.01)
    *G01R 31/36*   (2019.01)

(52) U.S. Cl.
    CPC ......... *G01R 31/367* (2019.01); *G01R 31/387* (2019.01)

(58) Field of Classification Search
    CPC .................... G01R 31/3634; G01R 31/3651
    See application file for complete search history.

(56) References Cited

U.S. PATENT DOCUMENTS

| | | | | |
|---|---|---|---|---|
| 5,463,305 A * | 10/1995 | Koenck | ............ | G01R 31/3655 320/145 |
| 6,075,340 A * | 6/2000 | Koenck | ............ | G01R 31/3655 320/112 |
| 6,285,163 B1 * | 9/2001 | Watanabe | ............ | G01R 31/3662 320/132 |
| 6,829,562 B2 | 12/2004 | Sarfert | | |
| 7,965,059 B2 * | 6/2011 | Plett | ............ | G01R 31/3648 320/132 |
| 7,967,995 B2 | 6/2011 | Funk et al. | | |
| 8,093,902 B2 * | 1/2012 | Nishi | ............ | G01R 31/3624 324/427 |
| 9,046,583 B2 * | 6/2015 | Joe | ............ | G01R 31/3665 |
| 2005/0057255 A1 * | 3/2005 | Tate, Jr. | ............ | G01R 31/3624 324/426 |
| 2009/0048793 A1 * | 2/2009 | Schoch | ............ | G01R 31/3624 702/63 |

(Continued)

FOREIGN PATENT DOCUMENTS

| | | |
|---|---|---|
| CN | 101394672 A | 3/2009 |
| CN | 101551834 A | 10/2009 |

(Continued)

*Primary Examiner* — Manuel A Rivera Vargas
*Assistant Examiner* — Yaritza H Perez Bermudez
(74) *Attorney, Agent, or Firm* — Slater Matsil, LLP

(57) ABSTRACT

Methods and devices for determining at least one parameter of a model of a technical installation are provided. In this case, the parameters are updated on the basis of measurements as a function of an observation matrix. The observation matrix is prescribed as a function of the model and being able, if appropriate, to depend on a time variable which can be measured.

24 Claims, 3 Drawing Sheets

(56) References Cited

U.S. PATENT DOCUMENTS

| | | | | |
|---|---|---|---|---|
| 2010/0153038 A1* | 6/2010 | Tomura | ............... | G01R 31/3624 |
| | | | | 702/63 |
| 2012/0109443 A1* | 5/2012 | Takahashi | ............... | B60L 1/003 |
| | | | | 701/22 |
| 2012/0139546 A1* | 6/2012 | Wortham | ............. | G01R 31/362 |
| | | | | 324/427 |
| 2013/0076363 A1* | 3/2013 | Takahashi | ........... | G01R 31/3634 |
| | | | | 324/427 |
| 2013/0116954 A1* | 5/2013 | Tazoe | ................ | G01R 31/3624 |
| | | | | 702/63 |
| 2014/0372056 A1* | 12/2014 | Lunglmayr | ........ | G01R 31/3634 |
| | | | | 702/63 |

FOREIGN PATENT DOCUMENTS

| | | |
|---|---|---|
| CN | 101604005 A | 12/2009 |
| CN | 102998629 A | 3/2013 |
| CN | 103018519 A | 4/2013 |
| CN | 103020445 A | 4/2013 |
| CN | 103116136 A | 5/2013 |
| EP | 1231475 A2 | 8/2002 |
| JP | 2010033616 A | 2/2010 |

* cited by examiner

METHOD AND DEVICE FOR DETERMINING A PARAMETER OF A MODEL OF A TECHNICAL INSTALLATION

This application claims priority to German Patent Application 10 2013 106 083.8, which was filed Jun. 12, 2013 and is incorporated herein by reference.

TECHNICAL FIELD

The present invention relates to methods and devices for determining at least one parameter of a model of a technical installation.

BACKGROUND

The behavior of technical devices can frequently be described by models, for example, in the form of equations. Such models frequently include one or more parameters which have to be determined before the model can then be used to describe the technical installation. For example, a relaxation of an open terminal voltage of a battery can be described with the aid of an equation which includes parameters. If the parameters are known or estimated, it is possible, for example, to use the model to determine an open terminal voltage in the completely relaxed state (that is to say after a long time), the open terminal voltage being, in turn, characteristic for a charging state (degree of charge or degree of discharge) of the battery.

In order to determine such parameters of the model, it is customary to measure at least one physical quantity of the technical installation (for example, a battery voltage against time in the above example of a battery) and then to adapt the parameters in such a way that the model describes the measurement as well as possible. Various algorithms are known for adapting the parameters, for example, the least-square algorithm or the least-mean-square algorithm.

In some cases, here, the at least one physical quantity of the technical installation is repeatedly measured. In such cases, it can be desirable to be able to further adapt the parameter or the parameters of the model with each measurement, and not to have to wait until all the measurements are present. Recursive implementations exist for this purpose, for example of the least-square algorithm, but they require a comparatively high outlay on computation, which can entail, for example, a correspondingly high outlay on hardware for the implementation.

SUMMARY

Embodiments of the present application provide methods and devices which can be used to efficiently estimate one or more parameters of a model of a technical installation, in particular in cases where measured values are sequentially provided.

BRIEF DESCRIPTION OF THE DRAWINGS

Exemplary embodiments of the invention will now be described in more detail with reference to the attached drawing, in which.

DETAILED DESCRIPTION OF ILLUSTRATIVE EMBODIMENTS

Exemplary embodiments are explained in detail below. It is to be noted that these are considered purely as illustrative and not as restrictive. In particular, a description of an exemplary embodiment having a multiplicity of features or elements is not to be construed as meaning that all the features or elements are required for the implementation. Rather, it is possible in the case of other exemplary embodiments to omit some of the illustrated features or elements, or to replace them by alternative features or elements. It is also possible in the case of some exemplary embodiments to provide additional features or elements. Features and elements of various exemplary embodiments can be combined with one another, unless otherwise specified.

In the case of exemplary embodiments which are not explained in more detail below, use is made of a gradient method which approximates the least-square algorithm, in order to estimate parameters of a model of a technical installation. A technical installation is to be understood as any type of technical installation, for example, technical unit, system, device and the like on which it is possible to measure physical quantities which can then in turn be used to estimate the parameters of the model.

Figure 1:
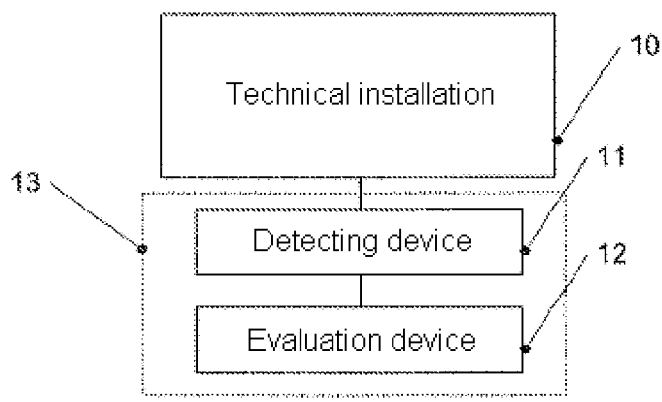
FIG. 1 shows a block diagram of a device in accordance with an exemplary embodiment.

A device 13 in accordance with an exemplary embodiment is illustrated schematically in a block diagram in FIG. 1. In this case, the device 13 serves to determine, in particular estimate, one or more parameters of a model of a technical installation 10. In the context of this application, a model of a technical installation is to be understood here as a mathematical description of properties of the technical installation, for example, of a time response of the technical installation.

The device 13 comprises a detecting device 11, for example one or more sensors, measurement units and the like, in which one or more physical quantities of the technical installation 10 can be detected. For example, the detecting device 11 can detect one or more quantities such as, for example, a current, a voltage, a temperature, a length or a force. In particular, the detection can be performed in this case with a prescribed scanning rate over time. An evaluation device 12 evaluates the detected physical quantity (quantities) and adjusts the parameters of the model of the detected quantity (quantities), it being possible to perform the adjustment again with each detected value of the physical quantity during detection over time. The evaluation device 12 can, in particular, have an appropriately programmed microprocessor with an assigned memory for this evaluation. In the case of other exemplary embodiments, the evaluation can be implemented directly by dedicated hardware, for example, in the form of an application specific integrated circuit (ASIC). Options for determining or estimating the parameters which can be implemented in the evaluation device 12 are explained in more detail further below, in particular with reference to FIG. 3.

Figure 2:
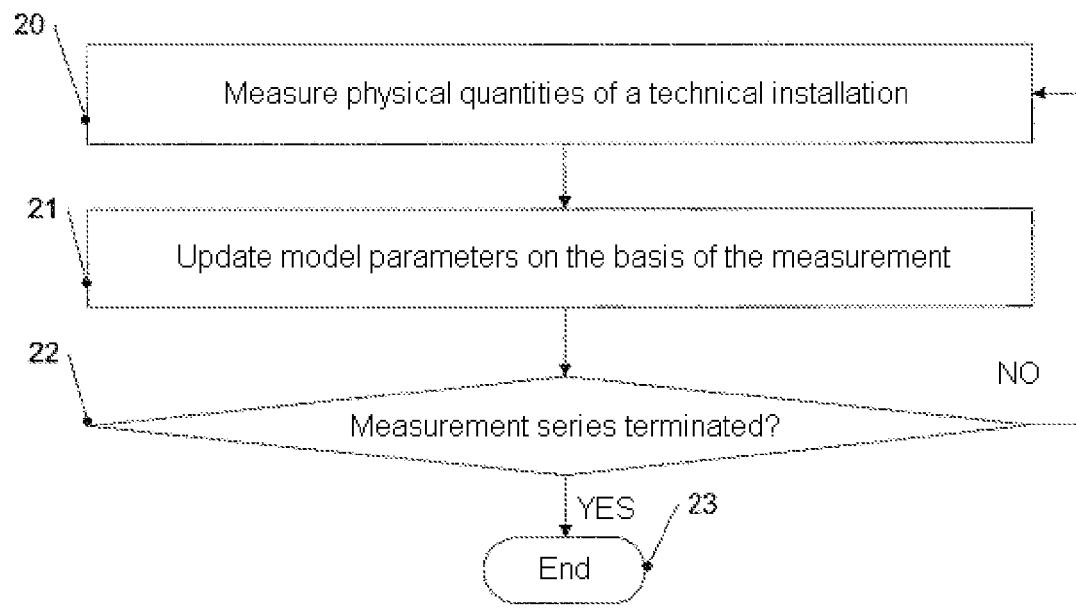
FIG. 2 shows a flowchart for the purpose of illustrating a method in accordance with an exemplary embodiment.

A flowchart for illustrating a method in accordance with an exemplary embodiment is illustrated schematically in FIG. 2. The method of FIG. 2 can, for example, be implemented by the device 13 of FIG. 1, but can also be used in other devices or systems.

At 20, one or more physical quantities of a technical installation, for example voltage, current, length, force or temperature, are measured. At 21, one or more parameters of a model of the technical installation are updated on the basis of the measurement. If at 22, the measurement series is terminated (YES at 22), the method is terminated at 23, and the parameters of the model which were last updated at 21 constitute the result of the method. On the basis of these model parameters, it is then possible, for example, to predict a response of the system with the aid of the model. While the measurement series is not yet terminated (NO at 22), the method is continued at 20 in order to measure the one or more physical quantities at successive scanning instants, for example. In the case of some exemplary embodiments, the physical quantity changes in this case from measurement to measurement on its own, as it were, for example when the quantity describes a decay response of a system or the like. In the case of other exemplary embodiments, it is possible between measurements to vary ambient parameters, for example ambient temperature, ambient brightness or the like, in a controlled fashion in order thus to describe the dependence of the measured physical quantity as a function of the ambient parameter in a model.

Examples for the evaluation in the evaluation device 12 of FIG. 1 and for the updating of the model parameters at 21 in FIG. 2 are represented below with reference to FIG. 3. In this case, the procedures represented illustrate, in particular, sequential approximations of the least-square algorithm.

A cost function $J(\theta)$ of the least-square algorithm can be written in this case as $$J(\theta) = \sum_{n=0}^{N-1} (y[n] - s[n;\theta])^2 = \sum_{n=0}^{N-1} e^2[n] = e^T e. \quad (1)$$

Here, $\theta$ is a vector which includes the parameter to be determined, and $y[n]$ is an nth measured value of the physical quantity, n running from 0 to N−1 so that N represents a total number of measured values (for example, measured values of a physical quantity recorded at N times). In this case, it is to be noted that physical quantities can generally be measured directly or indirectly. In the case of an indirect measurement, one or more other physical quantities is/are measured, and the physical quantity is derived from them. $s[n;\theta]$ represents the value of the models for the nth measured value when use is made of the parameter $\theta$. $e[n]$ specifies the error value $y[n]-s[n;\theta]$. In one exemplary embodiment, a vector s which includes as components the values $s[n;\theta]$, where n=0 ... N−1, can also be written as $H\theta$, in the case of a number p of parameters (p≥1) the matrix H being an N×p matrix and is denoted as observation matrix. The vector e can also be formed from the components $e[n]$, and a vector y can be formed from the components $y[n]$, and so it holds that $e=(y-s)$ or $e=(y-H\theta)$. In this case, a vector primed with a T denotes below the transposition, that is to say the row vector, for example, while otherwise vectors are to be understood as row vectors, or vice versa. In the case of a matrix, the primed T signifies the transposed matrix. Note that generally it is possible in the case of each of the equations represented to convert row vectors into column vectors by transposition, and vice versa, without the content of the equation being changed in the process.

The gradient (a vector)

$$\nabla = \frac{\partial J(\theta)}{\partial \theta}$$

of the cost function $J(\theta)$ is given by $$\frac{\partial J(\theta)}{\partial \theta} = \nabla = -2H^T y + 2H^T H\theta. \quad (2)$$

The gradient can also be written as $$\nabla = -2 \cdot \left( \sum_{n=0}^{N-1} h[n]^T y[n] \right) + 2 \cdot \sum_{n=0}^{N-1} (h[n]^T h[n])\theta, \quad (3)$$

$h[n]$ denoting the row n of the matrix H which is assigned to the nth measured value, for example the scanning time. The aim is now to find the minimum of the cost function $J(\theta)$. This can be written, for example, as $$\hat{\theta} = (H^T H)^{-1} H^T y \quad (4)$$

$\hat{\theta}$ denoting an estimate for the parameters $\theta$.

In order to be able to carry out the calculation according to equation (4), however, all the scanned values have to be present. On the other hand, in the case of some exemplary embodiments use is made of a calculation method in which the parameter vector $\theta$ is updated with each measured value $y[n]$.

Figure 3:
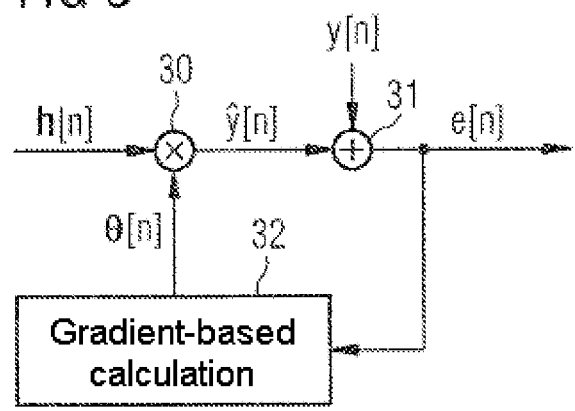
FIG. 3 shows a diagram for the purpose of illustrating an exemplary embodiment.

The fundamental principle is illustrated schematically in FIG. 3. In FIG. 3, $\hat{y}[n]$ denotes the output of the model given the presence of the measured value number n, also denoted below as scanning instant n, a parameter vector $\theta[n]$ likewise being fundamental here at the scanning instant n. The value $\hat{y}[n]$ is then subtracted in a subtractor 31 from the nth measured value $y[n]$ in order to form an error value $e[n]$. The next (updated, that is to say n increased by 1) parameter vector $\theta[n]$ is then calculated on the basis of the error value $e[n]$ by a gradient-based calculation 32. The value $\hat{y}[n]$ is formed by multiplying the parameter vector $\theta[n]$ by the vector $h[n]$ in a multiplier 30, n being increased with each pass of the loop. Here, $h[n]$ denotes the used row of the matrix H at the scanning time n, as described above. In the exemplary embodiments here, the matrix H is a matrix specific to the respective technical installation and which is prescribed as a function of n, that is to say it is known. Thus, in exemplary embodiments it is not formed during carrying out by convolution, filtering or the like, for example, but is known from the start, or its calculation rule is known from the start as a function of n or, in general, time. The time parameter n can then, for example, be measured in order, for example, to determine a part of the matrix H (for example $h[n]$) that is required for a respective calculation step, for example by the detecting device 11 of FIG. 1. In some exemplary embodiments, time, or a parameter characterizing time, is the only parameter of the observation matrix which is to be measured during the determination of the model parameters with the aid of the procedure described, or is to be determined in some other way, while otherwise—leaving aside the time dependence—the observation matrix is permanently prescribed for the respective technical installation and the associated model.

The time-dependent gradient $$\frac{\partial J(\theta(n))}{\partial \theta}$$

of the cost function of the procedure described with reference to FIG. 3 can, for example, be described as $$\nabla[n] = \frac{\partial e^2[n]}{\partial \theta} = 2*h[n]^T y[n] + 2*h[n]^T h[n]\theta[n]. \quad (5)$$

In comparison to equation (3), this means in essence that equation (3) forms the sum of the gradient from equation (5) for the scanning instant n=0 . . . N−1. This means that when, for example, not all measurements are used or are available (for example, when measurements can be carried out only over a limited time), the procedure illustrated above with reference to FIG. 3 constitutes an approximation of the least-square algorithm.

The procedure has a relatively low computational outlay, for example, only 2(p+1) multiplications are required for each pass of the method, p being the number of the parameters. Depending on system, model and quality (for example, noise) of the measured values, the procedure described can nevertheless offer rapid convergence, such that only relatively few measured values are required in order to obtain a good approximation of the parameters θ.

The gradient-based calculation 32 from FIG. 3 can be performed in this case in accordance with θ[n]=θ[n−1]+2μh[n]e[n], in particular, μ being a step width which can be permanently prescribed, can decrease with each measurement, or be calculated as a function of the respective technical installation. The entire procedure from FIG. 3 can therefore be described as follows in this case:

1. Initialization:

$$\theta[-1]=0 \quad (6)$$

2. In each n≥0 (for example up to the termination of a measurement, for example a last scanning instant):

$$\hat{y}[n]=h[n]\theta[n-1] \quad (7)$$

$$e[n]=y[n]-\hat{y}[n] \quad (8)$$

$$\theta[n]=\theta[n-1]+2\mu h[n]e[n] \quad (9).$$

Here, equation 7 corresponds to the multiplication in the multiplier 30 of FIG. 3, equation 8 corresponds to the subtraction in the subtractor 31, and equation 9 corresponds to the gradient-based calculation 32 of FIG. 3.

The aim below is now to illustrate a particular example of the application of the above described exemplary embodiments, specifically in order to determine an open terminal voltage of a battery, in particular a rechargeable battery. The open terminal voltage of a rechargeable battery is in this case directly related to a charging state of the battery, it being possible, for example, to specify the charging state as the degree of charge (for example 90% charged, 80% charged etc.) or as the degree of discharge (for example, 90% discharged, 80% discharged etc.). The determination of such a charging state of a rechargeable battery is important for many mobile applications, for example cell phones, motor vehicles, cameras etc., for example in order that a user can be informed of the charging state.

In this case, the precise determination of the charging state requires as accurate as possible knowledge of the open terminal voltage in a relaxed state. However, it is typically possible, for example, for even a plurality of hours to pass until the terminal voltage of a battery used is completely relaxed, that is to say reaches a stationary value, for example, after the separation of a load from such a battery or after such a unit is switched into a state of low load (for example a rest mode). The unit is frequently brought into operation again within this period, and so the stationary state is not reached at all and therefore cannot be directly measured.

One procedure for determining the stationary value approximately nevertheless is in this case to measure the values of the open terminal voltage only for a relatively short time after the separation of a load from the battery or after the transition to a state of low load, and then to use the measured values to estimate a stationary state of the open terminal voltage. To this end, it is possible in the exemplary embodiments to make use, in particular, of the procedure described above with reference to FIG. 3 in order to determine parameters of a model for the relaxation process of the open terminal voltage, and then to determine the stationary state of the open terminal voltage from the model.

Figure 4:
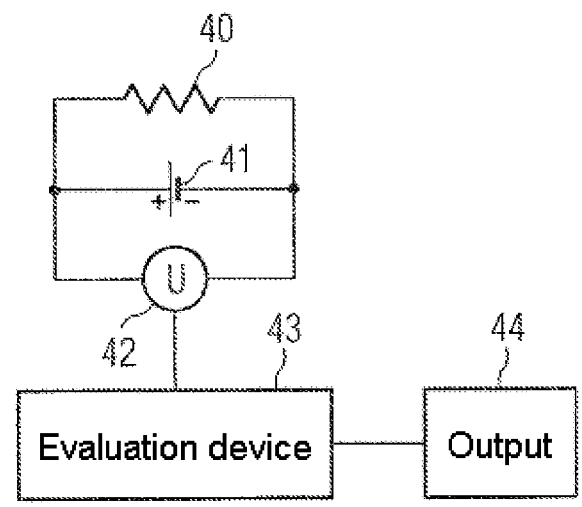
FIG. 4 shows a schematic of a device in accordance with an exemplary embodiment.

An appropriate device in accordance with an exemplary embodiment is shown in FIG. 4. The exemplary embodiment of FIG. 4 in this case constitutes an example of implementing the exemplary embodiment of FIG. 1 for the particular case of application of the determination of parameters of a model which determines a relaxation process of a battery 41.

Here, the battery 41 of FIG. 4 can be, in particular, a rechargeable battery which supplies a load 40 with current. The load 40 can represent one or more consumers of an appropriate technical installation such as a cell phone, a camera, a motor vehicle or any other mobile or stationary unit.

In a state of low load 40, for example a rest state, or a state in which the load 40 is separated from the battery 41, a voltmeter 42 measures the terminal voltage of the battery 41 in relation to a number of scanning instants. The evaluation device 43 uses the measured values in order to estimate a parameter of a model of the relaxation process of the battery. The open terminal voltage of the battery 41 in the stationary state can then be estimated therefrom and from this, in turn, the charging state of the battery can be determined (for example by a table). By way of example, the charging state can then be output via an output device 44, for example a display, in order to inform a user. In other exemplary embodiments, automatic measures can also be taken as a function of the determined charging state. For example, in the case of a motor vehicle with a low battery loading, that is to say a high degree of discharge of the battery 41, it is possible to start an auxiliary motor which is operated with a fuel such as petrol and in turn drives a generator in order to charge the battery 41, or in some exemplary embodiments heavy consumers can be deactivated in order to save current.

The response of the open terminal voltage can, for example, be described by the following model, it also being possible to use other models:

$$V_t = V_\infty - \frac{\Gamma\gamma}{t^\alpha \log^\delta(t)} \exp\left(\frac{\varepsilon_t}{2}\right). \quad (8)$$

Here, $V_t$ is the terminal voltage of the battery present at the instant t. In one exemplary embodiment, $V_t$ is measured, for example, during the relaxation phase at times $t_n$, n=1 . . . N. $V_\infty$ is a model parameter. γ, α and δ are parameters. Γ is set to +1 or −1, depending on whether there was a preceding charging phase or a discharging phase. In order to estimate the parameters γ, α and δ, equation (8) is transformed into an ordinary linear estimation problem of the least-square algorithm, and this the exponential multiplicative error structure, which is characterized by the term $$\exp\left(\frac{\varepsilon_t}{2}\right).$$

ε is a further parameter dependent on t and corresponds in essence to the error term e[n].

The following formulation can be selected for the discharge case by referring to equation (8):

$$\hat{y}[n]=h[n]*\theta[n]+e[n] \quad (9),$$

where $$\hat{y}[n]=\log(\hat{V}_{\infty,n}-V_{t,n})^2 \quad (10)$$

$$h[n]=[1,\log(n),\log(\log(n))] \quad (11)$$

$$\theta[n]=[C,A,D] \quad (12).$$

Here, $\hat{V}_{\infty,n}$ is a value for $V_\infty$ calculated from the model (compare equation (8)) in relation to the time step n, while $V_{t,n}$ denotes a corresponding nth measured value, that is to say the measured value at time $t_n$.

The parameters C, A and D are derived from the above parameters γ, α and δ in accordance with C=2×log(γ), A=−2×α and D=−2×δ.

As is to be seen, in particular the matrix H is formed by the vectors h[n], prescribed by system properties and is a function of time (or of the time index n).

During successive measurement of the values $V_t$, n, the procedure described above with reference to FIG. 3 and equations (7)-(9) can be applied to the valves thus defined in order thus to obtain the parameters C, A, D and, at the very last, also to obtain an updated estimate of the parameter $V_\infty$, specifically $\hat{V}_{\infty,n}$, in each pass.

In order to estimate the open terminal voltage in a relaxed state, $V_t$ can then be calculated for a long time t, for example t=3 h, by the model and the estimated parameters.

Figure 5:
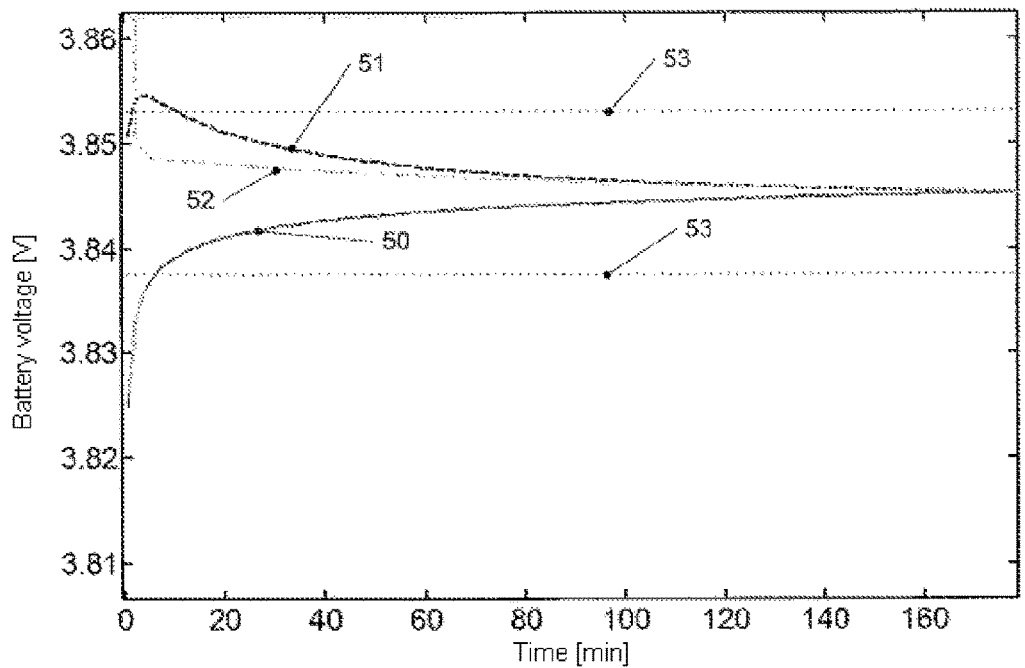
FIGS. 5 and 6 show diagrams with curves for the purpose of illustrating the mode of operation of methods and devices in accordance with exemplary embodiments.
Figure 6:
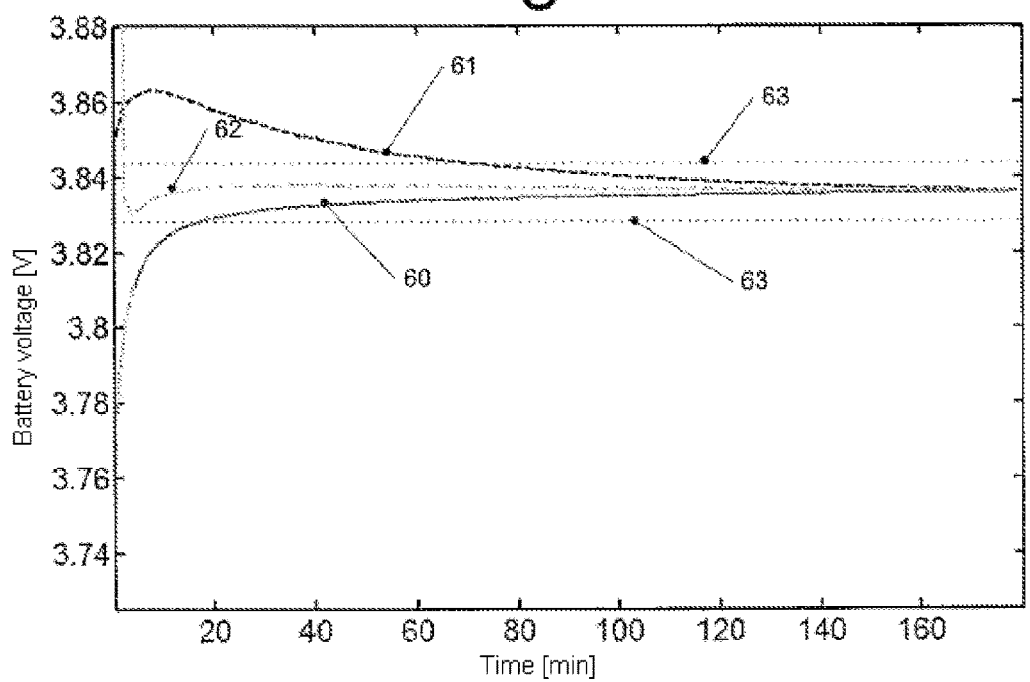

Examples of the performance of the procedure for a discharge process of a rechargeable battery are illustrated in FIGS. 5 and 6. Here, the relaxation process is respectively illustrated for a degree of discharge of 95%, a preceding discharge having occurred at a current rate of 0.1 C in FIG. 4, while having occurred with a higher current rate of 0.5 C in FIG. 5. The unit C in this case indicates the discharging current (or charging current) on the basis of the battery capacity. A current rate of 1 C specifies the current rate which can be drawn from the battery over one hour until the battery is fully discharged. In the case of a battery with a capacity of 1.9 Ah, a current rate of 1 C, for example, corresponds to a discharge current of 1.9 A. Here, the battery voltage is plotted in FIGS. 5 and 6 against time, in each case.

A measured curve of the terminal voltage is denoted by 50 in FIG. 5. 51 denotes a curve in the case of which a stationary value of the open terminal voltage is estimated on the basis of a conventional sequential estimation method. What is plotted here in each case is the terminal voltage determined based on estimates up to the respective time of measured values. A curve 52 in FIG. 5 shows values for the open terminal voltage determined with the procedure described above in accordance with an exemplary embodiment. Lines 53 indicate a desired range of accuracy for the estimate. There is to be seen, using the above named procedure in accordance with the exemplary embodiment the estimate (curve 52) is within a few minutes within the desired range of accuracy.

Illustrated correspondingly in FIG. 6 by 60 is a measured curve, by 61 a curve based on estimates from a conventional method, and by 62 a curve based on estimates using the above described procedure in accordance with an exemplary embodiment. Again, a desired range of accuracy is denoted by 63. Here, as well, an estimate for the open terminal voltage within the desired range of accuracy can be attained within about 3 minutes. A quicker estimation of the open terminal voltage is possible in both cases using the above named procedure than using the conventional method.

It must, however, be remarked that FIGS. 5 and 6 serve merely for illustration, and that all numerical values are to be seen merely as examples for a specific battery type under specified conditions. The values can differ in the case of other implementations. Overall, the determination of the open terminal voltage of a battery is to be understood merely as an example of application and, as explained at the beginning, exemplary embodiments can be used in general for the purpose of estimating parameters of a model of a technical installation.

What is claimed is:

1. A method comprising:
  performing a plurality of terminal voltage measurements of a battery in a low load condition;
  using an evaluation device, estimating at least one parameter of a model that describes a relaxation of a terminal voltage of the battery over time based on the plurality of terminal voltage measurements, wherein estimating the at least one parameter comprises
    initializing at least one parameter at a prescribed value, and
    for each of the plurality of terminal voltage measurements,
      determining a model-based estimate of the terminal voltage as a function of a previous value of the at least one parameter and of at least one part of an observation matrix, the observation matrix being an observation matrix prescribed as a function of the model;
      determining an error value as a function of the model-based estimate of the terminal voltage and of a current terminal voltage measurement of the plurality of terminal voltage measurements, and
      determining an updated value of the at least one parameter as a function of the previous value of the at least one parameter, of the error value and of the at least one part of the observation matrix;
  after estimating the at least one parameter, estimating a relaxed terminal voltage based on the at least one parameter, the relaxed terminal voltage representing a future value of an open circuit voltage of the battery when the battery is completely relaxed; and
  determining a charging state of the battery based on the estimated relaxed terminal voltage.

2. The method as claimed in claim 1, wherein the observation matrix has components dependent on a time variable.

3. The method as claimed in claim 2, wherein the time variable is measured in order to determine the at least one part of the observation matrix.

4. The method as claimed in claim 1, wherein the determination of the estimate is undertaken in accordance with $$\hat{y}[n]=h[n]\theta[n-1],$$

ŷ[n] being the model-based estimate of the terminal voltage, h[n] being an nth row of the observation matrix, n being a time parameter which denotes a number of a pass of the determination of the estimate, of the determination of the error value and of the updating of the parameters, and θ[n−1] denoting a vector with values of the at least one parameter in a previous pass, the error value being determined in accordance with $e[n]=y[n]-ŷ[n]$, e[n] denoting the error value and y[n] denoting the current terminal voltage measurement of the plurality of terminal voltage measurements, and the parameters being updated in accordance with $θ[n]=θ[n-1]+2μh[n]e[n]$ μ denoting a step width.

5. The method as claimed in claim 1, wherein the model is described by $$V_t = V_\infty - \frac{\Gamma \gamma}{t^\alpha \log^\delta(t)} \exp\left(\frac{\varepsilon_t}{2}\right),$$

$V_t$ being the terminal voltage at time t, $V_\infty$ being a model parameter, and γ, α and δ being parameters to be estimated, ε being an error parameter, and Γ being set at + or 1 as a function of whether the battery was previously charged or discharged, the model being transformed into a linear problem in order to carry out the method.

6. The method as claimed in claim 5, wherein the determination of the estimate is undertaken in accordance with $ŷ[n]=h[n]θ[n-1]$, ŷ[n] being the model-based estimate of the terminal voltage, h[n] being an nth row of the observation matrix, n being a time parameter which denotes a number of a pass of the determination of the estimate, of the determination of the error value and of the updating of the parameters, and θ[n−1] denoting a vector with values of the at least one parameter in a previous pass, the error value being determined in accordance with $e[n]=y[n]-ŷ[n]$, e[n] denoting the error value and y[n] denoting the current terminal voltage measurement of the plurality of terminal voltage measurements, and the parameters being updated in accordance with $θ[n]=θ[n-1]+2μh[n]e[n]$, μ denoting a step width; and
wherein it holds that $ŷ[n]=\log(\hat{V}_{\infty,n}-V_{t,n})^2$ $h[n]=[1,\log(n),\log(\log(n))]$ $θ[n]=[C,A,D]$, $\hat{V}_{\infty,n}$ being an estimate of the model parameter $V_\infty$ in an nth time step, $V_{t,n}$ being a terminal voltage measurement of the plurality of voltage measurements in the nth time step, $C=2\times\log(\gamma)$, $A=-2\times\alpha$ and $D=-2\times\delta$.

7. The method as claimed in claim 1, wherein the low load condition is a condition in which a load is separated from the battery.

8. The method as claimed in claim 1, wherein the evaluation device comprises a processor.

9. The method as claimed in claim 1, wherein the evaluation device comprises dedicated hardware.

10. The method as claimed in claim 1, further comprising recharging the battery when the determined charging state indicates a high degree of discharge.

11. The method as claimed in claim 10, wherein recharging the battery comprises activating a generator coupled to the battery.

12. The method as claimed in claim 11, wherein activating the generator comprises starting an auxiliary motor that drives the generator.

13. A device comprising:
a voltmeter configured to measure a plurality of terminal voltage measurements of a battery in a low load condition; and
an evaluation device configured to estimate at least one parameter of a model that describes a relaxation of a terminal voltage of the battery over time based on the plurality of terminal voltage measurements by
initializing at least one parameter at a prescribed value, and
for each of the plurality of terminal voltage measurements,
determining a model-based estimate of the terminal voltage as a function of a previous value of the at least one parameter and at least one part of an observation matrix, the observation matrix being an observation matrix prescribed as a function of the model,
determining an error value as a function of the model-based estimate of the terminal voltage and a current terminal voltage measurement of the plurality of terminal voltage measurements, and
determining an updated value of the at least one parameter as a function of the previous value of the at least one parameter, of the error value and of the at least one part of the observation matrix,
wherein the device is configured, after the at least one parameter is estimated, to
estimate a relaxed terminal voltage based on the at least one parameter, the relaxed terminal voltage representing a future value of an open circuit voltage of the battery when the battery is completely relaxed, and
determine a charging state of the battery based on the estimated relaxed terminal voltage.

14. The device as claimed in claim 13, wherein the observation matrix has components dependent on a time variable.

15. The device as claimed in claim 14, wherein the voltmeter is configured to measure the time variable.

16. The device as claimed in claim 13, wherein the evaluation device is set up to determine the estimate in accordance with $ŷ[n]=h[n]θ[n-1]$ ŷ[n] being the model-based estimate of the terminal voltage, h[n] being an nth row of the observation matrix, n being a time parameter which denotes a number of a pass of the determination of the estimate, of the determination of the error value and of the updating of the parameters, and θ[n−1] denoting a vector with values of the at least one parameter in a previous pass, to determine the error value in accordance with $$e[n]=y[n]-\hat{y}[n]$$

e[n] denoting the error value and y[n] denoting the current terminal voltage measurement of the plurality of terminal voltage measurements, and the parameters being updated in accordance with, $$\theta[n]=\theta[n-1]+2\mu h[n]e[n]$$

μ denoting a step width.

17. The device as claimed in claim 13, wherein the model is described by $$V_t = V_\infty - \frac{\Gamma\gamma}{t^\alpha \log^\delta(t)}\exp\left(\frac{\varepsilon_t}{2}\right),$$

$V_t$ being the terminal voltage at time t, $V_\infty$ being a model parameter, and γ, α and δ being parameters to be estimated, ε being an error parameter, and Γ being set at + or 1 as a function of whether the battery was previously charged or discharged, the model being transformed into a linear problem.

18. The device as claimed in claim 17, wherein the evaluation device is set up to determine the estimate in accordance with $$\hat{y}[n]=h[n]\theta[n-1],$$

ŷ[n] being the model-based estimate of the terminal voltage, h[n] being an nth row of the observation matrix, n being a time parameter which denotes a number of a pass of the determination of the estimate, of the determination of the error value and of the updating of the parameters, and θ[n−1] denoting a vector with values of the at least one parameter in a previous pass, to determine the error value in accordance with $$e[n]=y[n]-\hat{y}[n],$$

e[n] denoting the error value and y[n] denoting the current terminal voltage measurement of the plurality of terminal voltage measurements, and the parameters being updated in accordance with, $$\theta[n]=\theta[n-1]+2\mu h[n]e[n],$$

μ denoting a step width; and
wherein it holds that $$\hat{y}[n]=\log(\hat{V}_{\infty,n}-V_{t,n})^2$$

$$h[n]=[1,\log(n),\log(\log(n))]$$

$$\theta[n]=[C,A,D],$$

$\hat{V}_{\infty,n}$ being an estimate of the model parameter V∞ in an nth time step, $V_{t,n}$ being a terminal voltage measurement of the plurality of voltage measurements in the nth time step, $C=2\times\log(\gamma), A=-2\times\alpha$ and $D=-2\times\delta$.

19. The device as claimed in claim 13, wherein the low load condition is a condition in which a load is separated from the battery.

20. The device as claimed in claim 13, wherein the evaluation device comprises a processor.

21. The device as claimed in claim 13, wherein the evaluation device comprises dedicated hardware.

22. The device of claim 18, wherein the device is further configured, after the at least one parameter is estimated, to cause the battery to be recharged when the determined charging state indicates a high degree of discharge.

23. The device of claim 22, wherein the evaluation device is configured to charge the battery by activating a generator coupled to the battery.

24. The device of claim 23, wherein activating the generator comprises starting an auxiliary motor that drives the generator.

* * * * *